United States Patent
Liu et al.

(10) Patent No.: US 10,741,796 B2
(45) Date of Patent: Aug. 11, 2020

(54) LIGHT-EMITTING PANEL CAPABLE OF EMITTING UNIFORM LIGHT AND METHOD FOR MANUFACTURING THE SAME

(71) Applicant: Shenzhen China Star Optoelectronics Technology Co. Ltd., Shenzhen, Guangdong (CN)

(72) Inventors: Zhaosong Liu, Guangdong (CN); Songshan Li, Guangdong (CN); Yuan Jun Hsu, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/324,181

(22) PCT Filed: Nov. 30, 2016

(86) PCT No.: PCT/CN2016/107828
§ 371 (c)(1),
(2) Date: Jan. 5, 2017

(87) PCT Pub. No.: WO2018/040329
PCT Pub. Date: Mar. 8, 2018

(65) Prior Publication Data
US 2018/0183012 A1    Jun. 28, 2018

(30) Foreign Application Priority Data
Aug. 31, 2016 (CN) .......................... 2016 1 0797760

(51) Int. Cl.
*H01L 51/52* (2006.01)
*H01L 27/32* (2006.01)
(Continued)

(52) U.S. Cl.
CPC ...... *H01L 51/5284* (2013.01); *H01L 27/3272* (2013.01); *H01L 51/0005* (2013.01);
(Continued)

(58) Field of Classification Search
CPC . H01L 27/3246; H01L 33/08; H01L 51/5044; H01L 51/5284; H01L 51/504; H01L 27/3272
See application file for complete search history.

(56) References Cited

U.S. PATENT DOCUMENTS 8,921,872 B2 * 12/2014 Ichikawa ................ H01L 33/50
257/88
9,837,638 B2 * 12/2017 Kim ........................ H01L 51/56
(Continued)

FOREIGN PATENT DOCUMENTS

CN        1798461         7/2006
CN      104241329        12/2014
(Continued)

OTHER PUBLICATIONS

Machine translation of JP 2011-076760 (Year: 2011).*
(Continued)

*Primary Examiner* — Shaun M Campbell
*Assistant Examiner* — Suberr L Chi

(57) ABSTRACT

Related to is the field of light-emitting panel manufacture, and a light-emitting panel and a method for manufacturing the same are provided, which aim to improve uniformity of light emission of an Organic Light-Emitting Diode (OLED) manufactured by Inkjet Printing (IJP). The light-emitting panel sequentially comprises an ITO substrate, a light-emitting layer, a light-shielding layer, and a cover glass. The method comprises forming a multilayer structure sequentially including an ITO substrate, a light-emitting layer, a light-shielding layer, and a cover glass. According to a size
(Continued)

of an edge warp of a light-emitting area of the OLED, a light-shielding layer is designed at a corresponding position of the light-emitting area on the cover glass, and a position of a non-uniform edge is subjected to light-shielding processing, so that the problem of non-uniform light emission caused by the edge warp of the organic light-emitting layer is solved. A display part can thus be uniformly showed, thereby effectively improving the uniformity of light emission of the OLED manufactured by IJP.

11 Claims, 5 Drawing Sheets

(51) Int. Cl.
    *H01L 51/00*     (2006.01)
    *H01L 51/50*     (2006.01)
    *H01L 51/56*     (2006.01)

(52) U.S. Cl.
    CPC ........ *H01L 51/504* (2013.01); *H01L 51/5237* (2013.01); *H01L 27/3246* (2013.01); *H01L 51/56* (2013.01); *H01L 2227/323* (2013.01); *H01L 2251/5315* (2013.01)

(56) References Cited

U.S. PATENT DOCUMENTS

| | | | |
|---|---|---|---|
| 2008/0030833 | A1* | 2/2008 | Park .................. G02F 1/133514 359/259 |
| 2012/0228603 | A1* | 9/2012 | Nakamura ............ H01L 27/322 257/40 |

FOREIGN PATENT DOCUMENTS

| | | |
|---|---|---|
| CN | 105140247 | 12/2015 |
| CN | 105470283 | 4/2016 |
| JP | 2008046306 | 2/2008 |
| JP | 2011076760 | 4/2011 |
| WO | 2009147838 | 12/2009 |

OTHER PUBLICATIONS

International Search Report and Written Opinion for International Application No. PCT/CN2016/107828, dated May 22, 2017.
Chinese Office Action and Search Report for Chinese Patent Application No. 201610797760.9 dated Jun. 26, 2017.

\* cited by examiner

LIGHT-EMITTING PANEL CAPABLE OF EMITTING UNIFORM LIGHT AND METHOD FOR MANUFACTURING THE SAME

CROSS-REFERENCE TO RELATED APPLICATIONS

The present application claims the priority of Chinese patent application CN 201610797760.9, entitled "Light-emitting panel and method for manufacturing the same" and filed on Aug. 31, 2016, the entirety of which is incorporated herein by reference.

FIELD OF THE INVENTION

The present disclosure relates to the field of manufacturing processes of light-emitting panels, and particularly, to a light-emitting panel and a method for manufacturing the same.

BACKGROUND OF THE INVENTION

With the development of display technologies, flat panel display devices, because of the advantages of high definition, power saving, body thinness, wide application scope, and the like, are widely applied to various consumer electronic products such as mobile phones, televisions, personal digital assistants, digital cameras, notebook computers, and desktop computers, and become mainstream display devices.

Organic light-emitting display devices have the features of self-illumination, high brightness, wide viewing angle, high contrast, flexibility, low energy consumption, and the like, and thus have attracted wide attention. As a new generation of display mode, the organic light-emitting display devices have begun to gradually replace traditional liquid crystal display devices, and are widely applied to electronic products such as mobile phone screens, computer monitors, and full-color televisions.

Compared with a display mode of a traditional liquid crystal display (LCD), the display technology of organic light-emitting diode (OLED) uses extra-thin organic material coatings and glass substrates without any backlights, and when a current flows through organic materials, these organic materials will emit light.

An active-matrix (AM) flat panel display device, a most commonly used display device currently, which controls input of data signals through a thin film transistor (TFT) switch, and thereby further controls display of images.

An existing thin film transistor-liquid crystal display (TFT-LCD) mainly comprises two glass substrates and a liquid crystal layer, wherein a surface of an upper glass substrate is provided with a color filter, and a lower glass substrate is provided with a thin film transistor and a pixel electrode. The color filter includes color photoresist and a black matrix. A position of the color photoresist corresponds to a position of the pixel electrode. The black matrix is formed among the color photoresist. In general, the black matrix is subject to the steps of coating, exposure, and development to form the surface of the upper glass substrate.

The aforementioned black matrix is indispensable in the color filter of the existing TFT-LCD. For a vertical alignment TFT-LCD, a liquid crystal, because of being in vertical state in the absence of electric field control, blocks light, so that an overall picture is rendered completely black at this moment, and no light leakage occurs. However, in the case that the pixel electrode is driven by a voltage, a liquid crystal angle on a metallic circuit connected with the pixel electrode will be changed because of transmittance of voltage signals, and thereby a light leakage problem is generated. Therefore, the black matrix is adopted for correspondingly shielding the metallic circuit around the pixel electrode so as to avoid the light leakage problem.

With the rapid development of the inkjet printing technology, more and more manufacturers manufacture OLED and organic light-emitting display devices by using the inkjet printing technology.

Inkjet printing (IJP), as a new method for manufacturing an organic layer of an Active Matrix-Organic Light-Emitting Diode (AM-OLED), has the features of high efficiency, low cost, and the like, and thus is paid much attention to by manufacturers.

In the process of manufacturing an AM-OLED by using IJP, a bank layer is required for defining a light-emitting area, but due to the hydrophilicity-hydrophobicity problem of bank materials, an organic layer manufactured through IJP will have a problem of thick edge warping.

A simple structure of an OLED device based on the inkjet printing technology in the prior art is shown in FIG. 1, and the AM-OLED includes a base 10, bank layers 11 provided on the base 10, and an organic light-emitting layer 12 disposed between the bank layers 11.

A first key step of inkjet printing is to process the bank layer 11 into a layer with surface hydrophobicity, and a second key step of inkjet printing is to jet OLED ink to a groove formed by the bank layer 11. Because most of OLED ink is hydrophilic, when the OLED ink is jetted to a bank material, due to the poor contact force of hydrophobic and hydrophilic materials, the OLED ink will roll into a groove formed by the bank layer 140. However, because a contact angle between the ink and the groove will directly affect the uniformity of the ink in the groove, when the OLED ink is jetted and the contact angle between the ink and the groove is improperly controlled (for example, the contact angle is greater than 90 degrees), the disadvantages of poor contact between an ITO base and an OLED material, existence of a clearance between the groove and the OLED material, and inhomogeneous distribution of the OLED material in a manner that a middle is thicker than two sides are caused, which is unfavorable for uniform light emission.

As shown in the figures, a situation that a surface of the organic light-emitting layer 12 is non-uniform will occur due to the edge warping of the organic light-emitting layer 12 in the AM-OLED, and the situation will eventually cause a problem of non-uniform light emission.

Current solutions focus on improvement of the uniformity through a procedure, such as adjustment of the hydrophobicity-hydrophilicity of the bank, but the method has a potential matching problem the bank and the ink, and thus has not been universally adopted.

SUMMARY OF THE INVENTION

The present disclosure aims to provide a light-emitting panel and a method for manufacturing the same, which improves uniformity of light emission of an Organic Light-Emitting Diode (OLED) manufactured by Inkjet Printing (IJP).

In order to solve the technical problem above, the present disclosure provides a light-emitting panel and a method for manufacturing the same.

According to a first aspect of the present disclosure, a light-emitting panel is provided, which includes an ITO substrate, a light-emitting layer, a light-shielding layer, and a cover glass which are sequentially stacked.

Preferably, the light-emitting layer includes isolation dam bodies and light-emitting bodies which are alternately arranged.

Preferably, multiple organic light-emitting layers are sequentially stacked in the light-emitting body.

Preferably, longitudinal cross sections of the isolation dam bodies are first isosceles trapezoids.

Preferably, a long bottom edge of the first isosceles trapezoid is located close to one side of the ITO substrate.

Preferably, the isolation dam body is obtained by exposure and development performed on an isolation layer;

Preferably, multiple openings are formed between adjacent isolation dam bodies while the isolation layer is being exposed and developed to form the isolation dam bodies.

Preferably, longitudinal cross sections of the multiple openings are second isosceles trapezoids.

The longitudinal cross section is in a direction perpendicular to a plane of the light-emitting panel.

Preferably, a short bottom edge of the second isosceles trapezoid is located close to one side of the ITO substrate.

Preferably, the multiple openings are used for placing the light-emitting bodies.

Preferably, adjacent light-emitting bodies are spaced by the isolation dam body.

Preferably, the light-shielding layer includes multiple light-shielding bodies.

Preferably, number of the light-shielding bodies is equal to number of the isolation dam bodies.

Preferably, the light-shielding bodies are located at positions corresponding to the isolation dam bodies.

Preferably, the light-shielding layer covers all areas of the isolation dam bodies and areas, close to the isolation dam bodies, of the light-emitting bodies.

Preferably, in the longitudinal cross section, length of the light-shielding body is equal to length of the long bottom edge of the first isosceles trapezoid formed by the isolation dam body.

Preferably, thickness of the light-shielding layer is less than 1 µm.

According to a second aspect of the present disclosure, a method for manufacturing the light-emitting panel is provided, which includes a procedure of forming a multilayer structure including an ITO substrate, a light-emitting layer, a light-shielding layer, and a cover glass which are sequentially stacked, wherein the light-emitting layer includes isolation dam bodies and light-emitting bodies which are alternately arranged, and multiple organic light-emitting layers are sequentially stacked in the light-emitting body.

Preferably, the procedure of forming a multilayer structure including an ITO substrate, a light-emitting layer, a light-shielding layer, and a cover glass which are sequentially stacked, wherein the light-emitting layer includes isolation dam bodies and light-emitting bodies which are alternately arranged, and multiple organic light-emitting layers are sequentially stacked in the light-emitting body, further includes the following steps and sub-steps.

In step 1, the light-emitting layer is manufactured on the ITO substrate, including the following sub-steps.

The ITO substrate is provided.

Specifically, the ITO substrate is used as an anode.

The isolation layer is coated on the ITO substrate.

Specifically, the isolation layer is a negative photoresist.

The isolation layer is exposed and developed so as to obtain isolation the dam bodies and the multiple openings.

Specifically, the longitudinal cross sections of the isolation dam bodies are first isosceles trapezoids.

Specifically, the long bottom edge of the first isosceles trapezoid is located close to one side of the ITO substrate.

Specifically, the multiple openings are formed between adjacent isolation dam bodies while the isolation layer is exposed and developed to form the isolation dam bodies.

Specifically, the longitudinal cross sections of the multiple openings are second isosceles trapezoids.

Specifically, the short bottom edge of the second isosceles trapezoid is located close to one side of the ITO substrate.

Sequentially stacked multiple organic light-emitting layers are manufactured at the formed multiple openings, i.e., forming the light-emitting body.

Specifically, adjacent light-emitting bodies are spaced by the isolation dam body.

Specifically, the multiple organic light-emitting layers are manufactured by inkjet printing.

Specifically, ink for inkjet printing is photocurable ink or thermal-curable ink.

In step 2, the light-shielding layer is manufactured on the cover glass, including the following sub-steps.

The cover glass is provided.

Specifically, the cover glass is non-alkali glass.

The multiple light-shielding bodies are formed on the cover glass, i.e., the light-shielding layer is formed.

Specifically, according to a size of an edge warp of the organic light-emitting layer, multiple light-shielding bodies are prepared on the cover glass.

Specifically, number of the light-shielding bodies is equal to number of the isolation dam bodies.

Specifically, the light-shielding bodies are located at the positions corresponding to the isolation dam bodies.

Specifically, the light-shielding layer covers all areas of the isolation dam bodies and areas, close to the isolation dam bodies, of the light-emitting bodies.

Specifically, in the longitudinal cross section, the length of the light-shielding body is equal to the length of the long bottom edge of the first isosceles trapezoid formed by the isolation dam body.

The longitudinal cross section is in the direction perpendicular to a plane of the light-emitting panel.

Specifically, the thickness of the light-shielding layer is less than 1 µm;

Specifically, the light-shielding material is coated on the cover glass. According to the size of the edge warp of the organic light-emitting layer, the sizes of the multiple light-shielding bodies are designed. The light-shielding material is exposed through a mask and then developed, to form the multiple light-shielding bodies with corresponding sizes on all areas of the isolation dam bodies and areas, close to the isolation dam bodies, of the light-emitting bodies, i.e., a light-shielding layer is formed.

Specifically, the light-shielding material is a photosensitive photoresist material.

Specifically, the photoresist material is a photosensitive resin to which a sensitizer is added.

Specifically, the photosensitive resin is gelatin, casein, polyvinyl alcohol, or polyvinylpyrrolidone.

Specifically, the sensitizer is ammonium dichromate.

Specifically, the photoresist material is a light-cured resin.

Specifically, the light-cured resin is a polyimide resin, a polyvinyl alcohol resin, an epoxy resin, or an acrylic resin.

Specifically, the photoresist material is an epoxy resin.

In step 3, packaging is performed, which includes the sub-step of packaging a light-emitting part manufactured in step 1 and a light-shielding part manufactured in step 2 with a sealant, so that the light-emitting panel is obtained.

Specifically, the isolation dam bodies manufactured in step 1 are aligned with the light-shielding bodies manufactured in step 2 under vacuum conditions, and then the sealant is pressurized to achieve fitting of the aligned bodies, followed by bake curing to complete the packaging.

Specifically, the sealant is an epoxy resin.

Compared with the prior art, one or more embodiments in the above embodiments may have the following advantages and beneficial effects.

According to the present disclosure, to solve the problem of non-uniform light emission at the edge of the organic light-emitting layer in the light-emitting panel, i.e., an OLED with a top emission function, in an IJP manufacturing procedure, based on the size of the edge warp of a light-emitting area of the OLED, the light-shielding layer is designed at a corresponding position of the light-emitting area on the cover glass, and light-shielding is performed on a position of the edge subject to non-uniform light emission, so that a display part is shown uniformly. In order to ensure that a viewing angle is not affected too much, the thickness of the light-shielding layer is designed to be less than 1 μm, thereby effectively improving the uniformity of light emission of the OLED manufactured by IJP.

Other features and advantages of the present disclosure will be further explained in the following specification, and will partly become self-evident therefrom, or be understood through the implementation of the present disclosure. The objectives and other advantages of the present disclosure will be achieved and obtained through the structures specifically pointed out in the specification, claims, and the accompanying drawings.

BRIEF DESCRIPTION OF THE DRAWINGS

The accompanying drawings further illustrate the present disclosure, and constitute a part of the specification. They are jointly adopted with embodiments of the present disclosure for explaining the present disclosure, and do not restrict the present disclosure. In the accompanying drawings.

In the accompanying drawings, same components are labeled with same accompanying drawing signs. The accompanying drawings are not shown in actual proportion.

DETAILED DESCRIPTION OF THE EMBODIMENTS

In the following, the present disclosure will be explained in detail with reference to accompanying drawings and embodiments, so that the process of how to solve technical problems by using technical means in the present disclosure and then achieve the technical effect may be fully understood and implemented hereby. It should be pointed out that the embodiments in the present disclosure and features in the embodiments may be mutually combined as long as no conflict is constituted, and the formed technical schemes all fall within the scope of the present disclosure.

For improving uniformity of light emission of an OLED manufactured by IJP, in embodiments of the present disclosure, a light-emitting panel capable of emitting uniform light and a preparation method thereof are provided, thereby solving the problem of non-uniform light emission due to an edge warp of an OLED light-emitting area (i.e., organic light-emitting layer) in the manufacturing process of the OLED by IJP.

Figure 9:
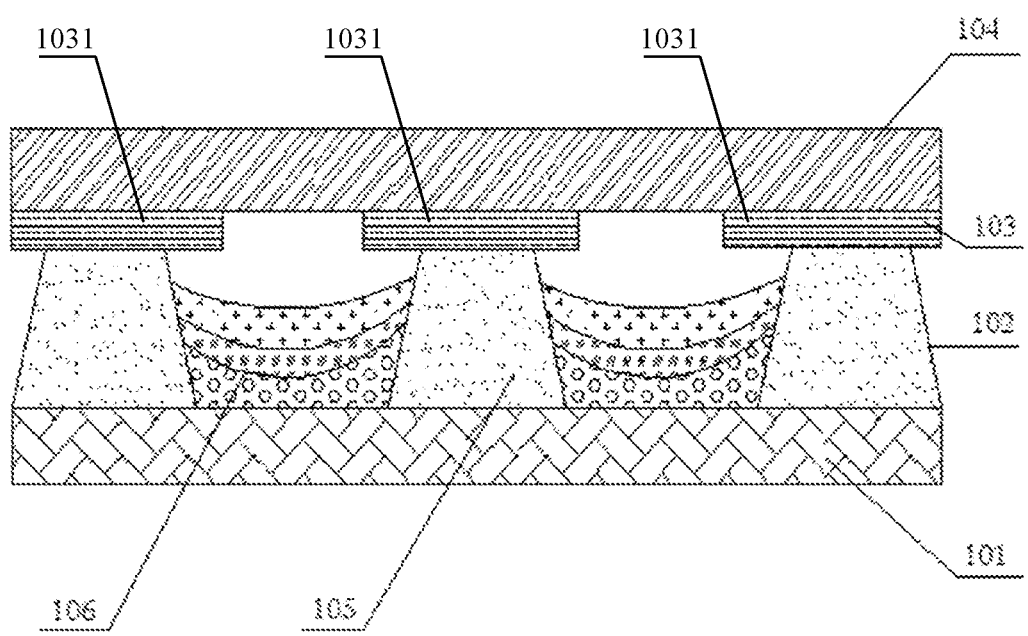
FIG. 9 shows a structural diagram of a light-emitting panel according to an embodiment of the present disclosure.

With reference to FIG. 9, a light-emitting panel disclosed by an embodiment of the present disclosure includes an ITO substrate 101, a light-emitting layer 102, a light-shielding layer 103, and a cover glass 104 which are sequentially stacked.

Preferably, the light-emitting layer 102 includes isolation dam bodies 105 and light-emitting bodies 106 which are alternately arranged.

Preferably, multiple organic light-emitting layers are sequentially stacked in the light-emitting body 106.

Preferably, a longitudinal cross section of the isolation dam body 105 forms a first isosceles trapezoid.

Preferably, a long bottom edge of the first isosceles trapezoid is located close to one side of the ITO substrate 101.

Figure 1:
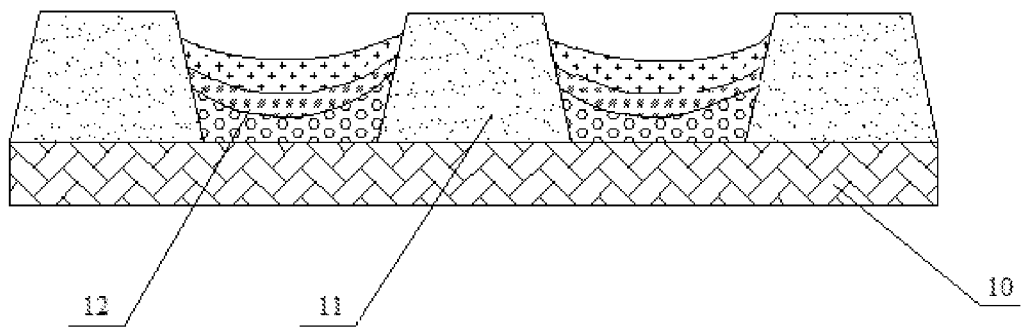
FIG. 1 shows a simple structure diagram of an OLED device based on the inkjet printing technology in the prior art.
Figure 2:
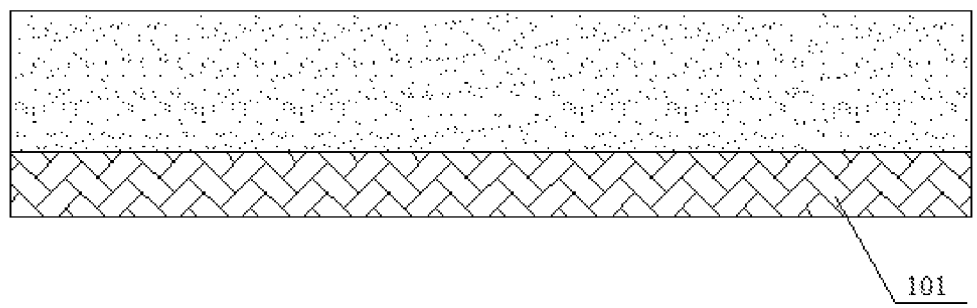
FIG. 2 shows a structural diagram after a photoresist material is coated on an ITO substrate in an embodiment of the present disclosure.
Figure 3:
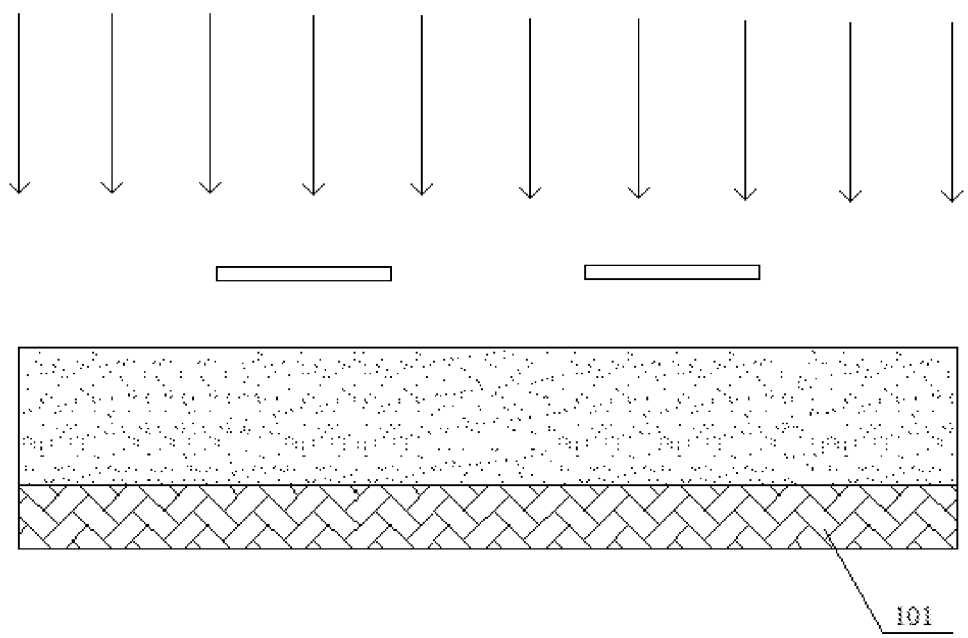
FIG. 3 schematically shows exposure of the photoresist material coated on the ITO substrate in an embodiment of the present disclosure.
Figure 4:
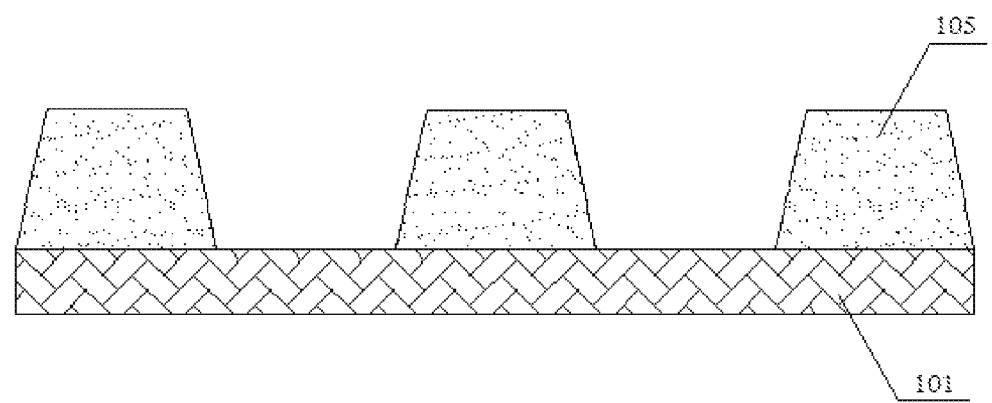
FIG. 4 schematically shows development of the photoresist material which has been exposed on the ITO substrate in an embodiment of the present disclosure.

Preferably, with reference to FIGS. 2-4, the isolation dam body 105 is obtained by exposure and development of an isolation layer, during which, multiple openings are formed between adjacent isolation dam bodies 105. A longitudinal cross section of the opening forms a second isosceles trapezoid.

The longitudinal cross section is in a direction perpendicular to a plane of the light-emitting panel.

Preferably, a short bottom edge of the second isosceles trapezoid is located close to one side of the ITO substrate 101.

Preferably, the multiple openings are used for placing the light-emitting bodies 106.

Preferably, adjacent light-emitting bodies 106 are spaced by the isolation dam body 105.

Preferably, the light-shielding layer 103 includes multiple light-shielding bodies 1031.

Preferably, the number of the light-shielding bodies is same as that of the isolation dam bodies 105.

Preferably, the light-shielding bodies are located at positions corresponding to the isolation dam bodies 105.

Preferably, the light-shielding layer 103 covers all areas of the isolation dam bodies 105 and areas, close to the isolation dam bodies 105, of the light-emitting bodies 106.

Preferably, in the longitudinal cross section, a length of the light-shielding body is equal to a length of the long bottom edge of the first isosceles trapezoid formed by the isolation dam body 105.

Preferably, a thickness of the light-shielding layer 103 is less than 1 μm.

With reference to FIGS. 2-9, in an embodiment of the present disclosure, a method for manufacturing the light-emitting panel is provided, which includes the following procedure.

A multilayer structure is formed including an ITO substrate 101, a light-emitting layer 102, a light-shielding layer 103, and a cover glass 104 which are sequentially stacked, wherein the light-emitting layer 102 includes isolation dam bodies 105 and light-emitting bodies 106 which are alternately arranged, and multiple organic light-emitting layers are sequentially stacked in the light-emitting body 106.

Preferably, a multilayer structure is formed, including the ITO substrate 101, the light-emitting layer 102, the light-shielding layer 103, and the cover glass 104 which are sequentially stacked; wherein the light-emitting layer 102 includes the isolation dam bodies 105 and the light-emitting bodies 106 which are alternately arranged, and multiple organic light-emitting layers are sequentially stacked in the light-emitting body 106 further includes the following steps and sub-steps.

As shown in FIGS. 2-5, in step 1, the light-emitting layer 102 is manufactured on the ITO substrate 101, including the following sub-steps.

An ITO substrate 101 is provided.

Specifically, the ITO substrate is used as an anode.

As shown in FIG. 2, an isolation layer is coated on the ITO substrate 101.

Specifically, the isolation layer is a negative photoresist.

As shown in FIGS. 3-4, the isolation layer is exposed and developed, so as to obtain the isolation dam bodies 105 and the multiple openings.

Specifically, the longitudinal cross section of the isolation dam body 105 is the first isosceles trapezoid.

Specifically, the long bottom edge of the first isosceles trapezoid is located close to one side of the ITO substrate 101.

Specifically, the multiple openings are formed between adjacent isolation dam bodies 105 while the isolation layer is being exposed and developed to form the isolation dam bodies 105.

Specifically, the longitudinal cross sections of the multiple openings form the second isosceles trapezoids.

Specifically, the short bottom edge of the second isosceles trapezoid is located close to one side of the ITO substrate 101.

Figure 5:
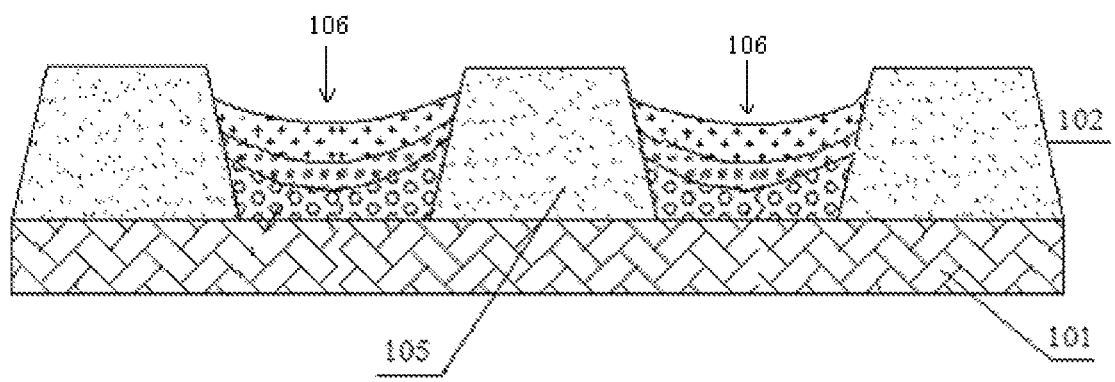
FIG. 5 shows a structural diagram after a light-emitting layer is formed in an embodiment of the present disclosure.

As shown in FIG. 5, sequentially stacked multiple organic light-emitting layers are manufactured at the formed multiple openings, i.e., the light-emitting body 106 are formed.

Specifically, adjacent light-emitting bodies 106 are spaced by the isolation dam body 105.

Specifically, the multiple organic light-emitting layers are manufactured by inkjet printing.

Specifically, ink used in inkjet printing is photocurable ink or thermal-curable ink.

Figure 6:
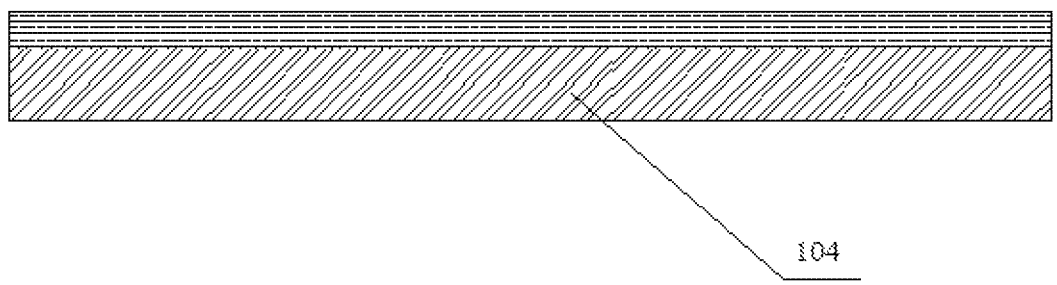
FIG. 6 shows a structural diagram after a light-shielding material is coated on a cover glass in an embodiment of the present disclosure.
Figure 7:
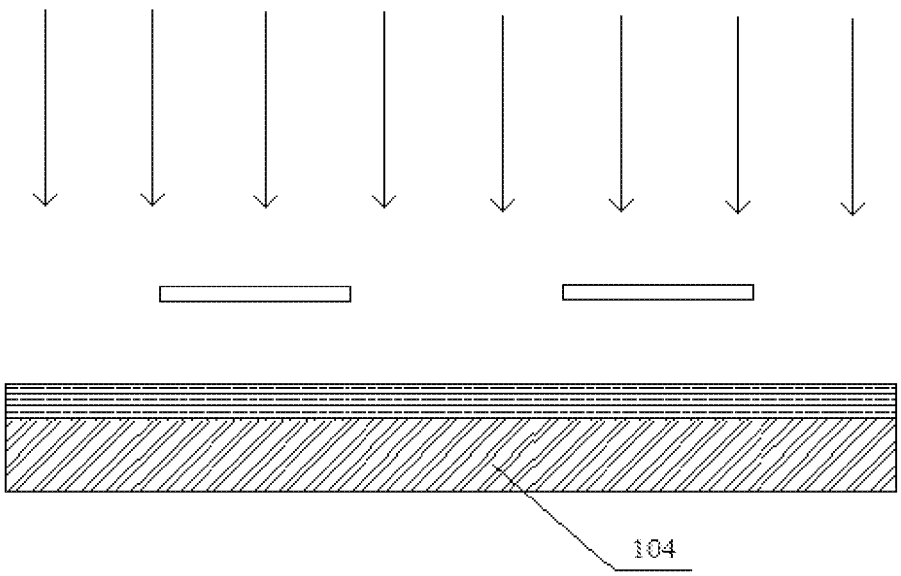
FIG. 7 schematically shows exposure of the light-shielding material on the cover glass in an embodiment of the present disclosure.
Figure 8:
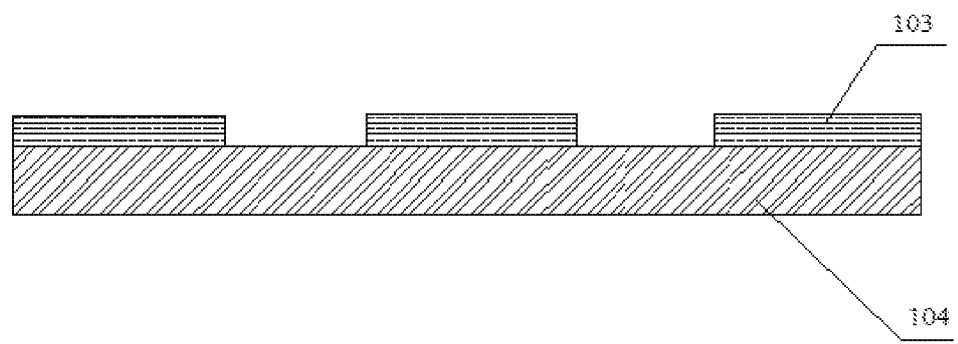
FIG. 8 schematically shows development of the light-shielding material, which has been exposed on the cover glass in an embodiment of the present disclosure.

As shown in FIGS. 6-8, in step 2, the light-shielding layer 103 is manufactured on the cover glass 104, including the following sub-steps.

A cover glass 104 is provided.

Specifically, the cover glass 104 is made of non-alkali glass.

As shown in FIG. 8, the multiple light-shielding bodies are formed on the cover glass 104, i.e., a light-shielding layer 103 is formed.

Specifically, according to the size of an edge warp of the organic light-emitting layer, the multiple light-shielding bodies are prepared on the cover glass 104.

Specifically, the number of the light-shielding bodies is equal to the number of the isolation dam bodies 105.

Specifically, the light-shielding bodies are located at the positions corresponding to the isolation dam bodies 105.

Specifically, the light-shielding layer 103 covers all areas of the isolation dam bodies 105 and areas, close to the isolation dam bodies 105, of the light-emitting bodies 106.

Specifically, in the longitudinal cross section, the length of the light-shielding body is equal to the length of the long bottom edge of the first isosceles trapezoid formed by the isolation dam body 105.

The longitudinal cross section is in the direction perpendicular to the plane of the light-emitting panel.

Specifically, the thickness of the light-shielding layer is less than 1 μm;

As shown in FIG. 6, a light-shielding material is coated on the cover glass 104, and according to the size of the edge warp of the organic light-emitting layer, the sizes of the multiple light-shielding bodies are designed. As shown in FIGS. 7-8, the light-shielding material is exposed through a mask, and then developed, so as to form the multiple light-shielding bodies with corresponding sizes on all areas of the isolation dam bodies 105 and areas, close to the isolation dam bodies, of the light-emitting bodies 106, i.e., the light-shielding layer 103 is formed.

Specifically, the light-shielding material is a photosensitive photoresist material.

Specifically, the photoresist material is a photosensitive resin to which a sensitizer is added.

Specifically, the photosensitive resin is gelatin, casein, polyvinyl alcohol, or polyvinylpyrrolidone;

Specifically, the sensitizer is ammonium dichromate.

Specifically, the photoresist material is a light-cured resin.

Specifically, the light-cured resin is a polyimide resin, a polyvinyl alcohol resin, an epoxy resin or an acrylic resin.

Specifically, the photoresist material is an epoxy resin.

As shown in FIG. 9, in step 3, packaging is performed, including the following sub-step.

A light-emitting part manufactured in step 1 and a light-shielding part manufactured in step 2 are packaged with a sealant, so that the light-emitting panel is obtained.

Specifically, the isolation dam bodies in the light-emitting part manufactured in step 1 are aligned with the light-shielding bodies in the light-shielding part manufactured in step 2 under vacuum conditions, and then the sealant is pressurized to achieve fitting of the aligned bodies, followed by bake cure to complete the packaging.

Specifically, the sealant is an epoxy resin.

Although the present disclosure is described with reference to specific embodiments in the text, it should be understood that these embodiments are only examples of the principle and use of the present disclosure. Thus, it should be understood that many modifications may be performed on the illustrative embodiments, and other arrangements may be designed as long as these modifications and arrangements do not depart from the spirit and scope of the present disclosure limited by the claims. It should be understood that different dependent claims and features described in the text may be combined in a different manner from that described in the original claims. It also should be understood that features described in combination with specific embodiments may be used in other embodiments.

The invention claimed is:

1. A light-emitting panel capable of emitting uniform light, comprising an ITO substrate, a light-emitting layer, a light-shielding layer, and a cover glass which are sequentially stacked,
wherein the light-emitting layer comprises isolation dam bodies and light-emitting bodies which are alternately arranged, multiple organic light-emitting layers being sequentially stacked in the light-emitting bodies; and
wherein the light-shielding layer comprises multiple light-shielding bodies spaced from each other;
wherein the multiple organic light-emitting layers are formed by an inkjet printing method, so that a top surface at a center position of each of the multiple organic light-emitting layers is substantially planer, and the top surface at an edge position of each of the multiple organic light-emitting layers is warped;
wherein each of the multiple light-shielding bodies directly contacts and covers one of the isolation dam bodies;
wherein all of the top surface at the edge position of each of the multiple organic light-emitting layers is covered by one of the multiple light-shielding bodies, and all of the top surface at the center position of each of the multiple organic light-emitting layers is exposed between an adjacent two of the multiple light-shielding bodies.

2. The light-emitting panel capable of emitting uniform light according to claim 1, wherein a longitudinal cross section of the isolation dam body forms a first isosceles trapezoid, and a long bottom edge of the first isosceles trapezoid is located close to one side of the ITO substrate.

3. The light-emitting panel capable of emitting uniform light according to claim 2, wherein in the longitudinal cross section, a length of the light-shielding body is equal to a length of the long bottom edge of the first isosceles trapezoid formed by the isolation dam body.

4. The light-emitting panel capable of emitting uniform light according to claim 2, wherein multiple openings are formed between adjacent isolation dam bodies, and longitudinal cross sections of the multiple openings form second isosceles trapezoids,
wherein a short bottom edge of the second isosceles trapezoid is located close to one side of the ITO substrate, and
wherein the multiple openings are used for placing the light-emitting bodies, adjacent light-emitting bodies being spaced apart by the isolation dam bodies.

5. The light-emitting panel capable of emitting uniform light according to claim 2, wherein a number of the light-shielding bodies is equal to a number of the isolation dam bodies, and the light-shielding bodies are located at positions corresponding to the isolation dam bodies.

6. The light-emitting panel capable of emitting uniform light according to claim 1, wherein a thickness of the light-shielding layer is less than 1 μm.

7. A method for manufacturing the light-emitting panel capable of emitting uniform light according to claim 1, comprising a procedure of forming a multilayer structure including the ITO substrate, the light-emitting layer, the light-shielding layer, and the cover glass which are sequentially stacked, wherein the light-emitting layer includes the isolation dam bodies and the light-emitting bodies which are alternately arranged, and the multiple organic light-emitting layers are sequentially stacked in the light-emitting body;
wherein the multiple organic light-emitting layers are formed by an inkjet printing method, so that a top surface at a center position of each of the multiple organic light-emitting layers is substantially planer, and the top surface at an edge position of each of the multiple organic light-emitting layers is warped;
wherein each of the multiple light-shielding bodies directly contacts and covers one of the isolation dam bodies;
wherein all of the top surface at the edge position of each of the multiple organic light-emitting layers is covered by one of the multiple light-shielding bodies, and all of the top surface at the center position of each of the multiple organic light-emitting layers is exposed between an adjacent two of the multiple light-shielding bodies.

8. The method for manufacturing the light-emitting panel capable of emitting uniform light according to claim 7, wherein the procedure of forming a multilayer structure including the ITO substrate, the light-emitting layer, the light-shielding layer, and the cover glass which are sequentially stacked, wherein the light-emitting layer includes the isolation dam bodies and the light-emitting bodies which are alternately arranged, and the multiple organic light-emitting layers are sequentially stacked in the light-emitting body, further includes:
step 1: manufacturing the light-emitting layer on the ITO substrate, comprising sub-steps of:
providing the ITO substrate; coating an isolation layer on the ITO substrate;
exposing and developing the isolation layer so as to obtain the isolation dam bodies and multiple openings; and
manufacturing the sequentially stacked multiple organic light-emitting layers at the formed multiple openings, namely, forming the light-emitting bodies;
step 2: manufacturing the light-shielding layer on the cover glass, comprising the sub-steps of:
providing the cover glass; and
forming the multiple light-shielding bodies on the cover glass, i.e., forming the light-shielding layer; and
step 3: performing packaging, comprising a sub-step of:
packaging a light-emitting part manufactured in step 1 and a light-shielding part manufactured in step 2 with a sealant, so that the light-emitting panel is obtained.

9. The method for manufacturing the light-emitting panel capable of emitting uniform light according to claim 8, wherein longitudinal cross sections of the isolation dam bodies are first isosceles trapezoids, a long bottom edge of the first isosceles trapezoid is located close to one side of the ITO substrate, and
wherein in the sub-step of exposing and developing the isolation layer so as to form the isolation dam body, the multiple openings are formed between adjacent isolation dam bodies, and longitudinal cross sections of the multiple openings form second isosceles trapezoids,
wherein a short bottom edge of the second isosceles trapezoid is located close to one side of the ITO substrate, and the multiple openings are used for placing the light-emitting bodies, adjacent light-emitting bodies being spaced apart by the isolation dam bodies.

10. The method for manufacturing the light-emitting panel capable of emitting uniform light according to claim 9, wherein a number of the light-shielding bodies is equal to a number of the isolation dam bodies, and the light-shielding bodies are located at positions corresponding to the isolation dam bodies.

11. The method for manufacturing the light-emitting panel capable of emitting uniform light according to claim 10, wherein the isolation dam bodies manufactured in step 1 are aligned with the light-shielding bodies manufactured in step 2 under vacuum conditions, followed by press fitting and bake curing to complete the packaging.

* * * * *